United States Patent [19]

Hall et al.

[11] Patent Number: 4,547,395

[45] Date of Patent: Oct. 15, 1985

[54] PROCESS FOR THE PHOTOCHEMICAL VAPOR DEPOSITION OF HETERO-LINKED POLYMERS

[75] Inventors: James T. Hall, Redondo Beach; Richard N. Leyden, Topanga, both of Calif.

[73] Assignee: Hughes Aircraft Company, El Segundo, Calif.

[21] Appl. No.: 674,627

[22] Filed: Nov. 26, 1984

[51] Int. Cl.[4] ............................................. B05D 5/12
[52] U.S. Cl. .............................. 427/54.1; 204/159.11; 252/500
[58] Field of Search .......................... 427/53.1, 54.1; 252/500; 549/13; 428/419; 204/159.11

[56] References Cited

U.S. PATENT DOCUMENTS

| | | | |
|---|---|---|---|
| 3,238,113 | 3/1966 | Bolt et al. | 204/159.11 |
| 3,264,202 | 8/1966 | King | 204/159.11 |
| 3,518,111 | 6/1970 | Wright et al. | 204/159.11 |
| 3,619,259 | 11/1971 | Wright et al. | 427/54.1 |
| 3,686,022 | 8/1972 | White et al. | 427/54.1 |
| 3,959,101 | 5/1976 | Staniland et al. | 204/159.11 |
| 4,330,570 | 5/1982 | Giuliani et al. | 427/54.1 |
| 4,363,829 | 12/1982 | Seshimoto et al. | 427/54.1 |

*Primary Examiner*—John H. Newsome
*Attorney, Agent, or Firm*—Mary E. Lachman; A. W. Karambelas

[57] ABSTRACT

A low temperature photochemical vapor deposition process for the deposition of a layer of a chosen polymer on the surface of a substrate. The polymer comprises repeating hydrocarbon units linked through oxygen, nitrogen, or sulfur atoms and is formed by reacting a vapor phase monomer precursor containing the hydrocarbon units and a vapor phase precursor containing the oxygen, nitrogen, or sulfur under radiation inducement. The low temperature of the process avoids thermal damage to the substrate. Specifically disclosed polymers are polyphenylether and polyxyleneamine, which are useful, respectively, as insulator or passivation layers in semiconductor devices and circuits, and as adhesives.

14 Claims, No Drawings

PROCESS FOR THE PHOTOCHEMICAL VAPOR DEPOSITION OF HETERO-LINKED POLYMERS

BACKGROUND OF THE INVENTION

1. Field of the Invention

The present invention relates generally to a process for forming polymers comprising alkyl or aryl groups linked through oxygen, nitrogen or sulfur atoms, and, more particularly, to a photochemical vapor deposition process for depositing thin layers of such polymers on a substrate.

2. Description of the Background Art

Dielectric or insulating materials such as silicon dioxide and silicon nitride are widely used in the fabrication of semiconductor devices and circuits to provide a layer of electrical insulation which prevents contact or unwanted current flow between adjacent conductive areas or materials. In addition, such insulating materials are used as a surface passivation layer to protect the surface of the substrate or as a mask during such procedures as etching or ion implantation. Such layers have typically been formed by thermal chemical vapor deposition at elevated temperatures, by plasma-enhanced chemical vapor deposition, or by reactive or nonreactive sputtering techniques. However, the latter three processes have the disadvantage of producing charge bombardment or radiation bombardment of the substrate and consequent degradation of device performance, while the thermal process produces thermal damage to the substrate. A recently developed process for oxide deposition which overcomes these disadvantages is the photochemical vapor deposition process described in U.S. Pat. No. 4,371,587, assigned to the present assignee. Similar photochemical processes for depositing nitride layers and sulfide layers are described in U.S. Pat. Nos. 4,181,751 and 4,447,469 respectively, both assigned to the present assignee.

As an alternative solution to the previously discussed difficulties in depositing oxide or nitride layers by conventional processes, as well as the problem of inadequate step coverage using such processes, it has been suggested that certain polymers be used as insulators in multilayer structures, as described, for example, by S. J. Rhodes in the publication entitled "Multilayer Metallization Techniques for VLSI High Speed Bipolar Circuits", in *Semiconductor International, March* 1981, pages 65–70. Rhodes describes a method of forming a layer of a polyimide on a metal layer by applying the polyimide in liquid form using conventional photoresist spin coating techniques and then curing the the material by a high temperature bake for imidization at 400° C. However, the elevated temperatures required in such processes in order to polymerize the monomer produce unwanted side-effects, such as the formation of hillocks and spikes in the underlying metal layer which, in turn, produces pinhole defects in the overlying insulator layer. In addition, elevated temperatures can produce boundary migration of defined regions in a semiconductor device and can result in degraded device performance and decreased device yield. Furthermore, processes requiring elevated temperatures are unsuitable for use on temperature-sensitive materials, such as certain plastics or mercury cadmium telluride and other compound semiconductor materials which decompose at temperatures as low as 120° C.

Thus, the need exists for a low-temperature process for depositing a layer of a polymer insulator on a substrate in the fabrication of semiconductor devices and circuits so that thermal damage to the substrate is avoided, while at the same time a good quality insulator layer is produced.

SUMMARY OF THE INVENTION

The general purpose of the present invention is to provide a new and improved process for depositing a layer of a chosen organic polymer on the surface of a substrate by a low-temperature photochemical vapor deposition process. This process possesses most, if not all, of the advantages of the above prior art processes while overcoming their above mentioned significant disadvantages.

The above described general purpose of this invention is accomplished by exposing the substrate to a first vapor phase reactant which is the monomer precursor containing hydrocarbon units and a second vapor phase reactant which is the precursor for oxygen, nitrogen, or sulfur, in the presence of radiation of a selected wavelength. Upon radiation inducement, the vapor phase reactants form a polymer comprising repeating hydrocarbon units joined by oxygen, nitrogen, or sulfur linkages, and the polymer deposits as a layer on the substrate.

Accordingly, it is a specific purpose of the present invention to provide a low-temperature process for depositing a polyether, polyamine, or polysulfide layer on a substrate without producing thermal damage to the substrate.

Another purpose is to provide a polymer material incorporating a controlled density of chemically bound oxygen, nitrogen, or sulfur.

Yet another purpose of the present invention is to provide a polymer layer having a graded refractive index which is determined by the amount of oxygen, nitrogen, or sulfur incorporated into the polymer.

A further purpose of the present invention is to provide an insulator layer for a semiconductor device, in which the layer exhibits good insulating properties and good step coverage.

The above discussed and many other features and attendant advantages of the present invention will become better understood by reference to the following detailed description of the invention.

DETAILED DESCRIPTION OF THE INVENTION

In accordance with a first embodiment of the present invention, a layer of a polyether is formed on the surface of a substrate by a vapor phase photochemical reaction between an oxygen-containing compound and a selected monomer, such as an aliphatic olefin, an aromatic, an alkyl aromatic, or a halogenated aromatic compound. More particularly, in accordance with a specific embodiment of the present invention, a substrate is exposed to bromobenzene vapor, nitrous oxide, mercury vapor as a photosensitizer, and radiation having a wavelength of 2537 angstroms (Å), such as from a low pressure mercury vapor lamp. As is known in the art of photochemical vapor deposition and discussed in U.S. Pat. No. 4,371,587, the radiation at 2537 Å is absorbed by the mercury to form mercury vapor in an excited state (Hg*) as shown in equation (1) below. The Hg* then interacts with and transfers energy to the nitrous oxide ($N_2O$) and causes dissociation thereof to form atomic oxygen (O), as shown in equation (2) below. While not limiting the present invention to a particular theory of operation, it is believed that the Hg* may interact with the monomer and transfer energy to the monomer to form an activated species as indicated by way of an intermediate reaction example in equation (3). The monomer, activated or inactivated, interacts with the atomic oxygen to form polyphenylether as indicated by way of example in equation (4). More specifically, since the bromine-carbon in the bromobenzene monomer is relatively weak, this bond may be severed by the energy transferred upon interaction with the Hg*, to form a radical having one active site, as indicated in equation (3) below. In addition, it is possible that a hydrogen-carbon bond in the bromobenzene may also be similarly severed, resulting in the formation of a radical having two active sites. It is also possible that a benzyne intermediate may be formed. Neither the exact mechanism for the formation of the active monomer species nor the sequence of intermediate steps by which oxygen becomes incorporated into the polymer chain has been determined.

  (1)

where
h = Planck's constant
c = speed of light
$\lambda$ = wavelength of absorbed radiation

  (2)

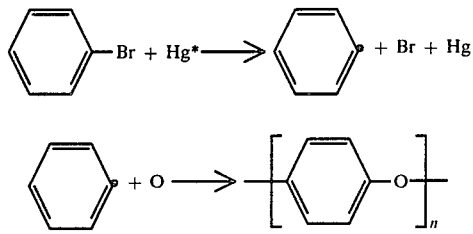

where
n = degree of polymerization.
• = active site

Based on experimental results for the solubility resistance of this polymer to methanol, propanol, and acetone, the degree of polymerization is believed to be within the range of at least 20 to 100 or higher.

An apparatus suitable for carrying out the above-described process is set forth in U.S. Pat. No. 4,371,587, which is modified to provide for the formation of the vapor phase reactant from liquid bromobenzene, as discussed in further detail herein.

The monomer may be a halogenated aromatic compound, such as a benzene ring having one or more bromine, chlorine, iodine, or fluorine substitutents, or another similarly substituted aromatic compound which is itself a vapor or capable of being readily vaporized (i.e. at a temperature below about 200° C.). Because of the relative bond strengths and ease of dissociation, an iodine substituent is most preferred in the practice of the present invention, followed, in turn, by bromine and chlorine. The substituent must be unreactive with atomic oxygen at least under deposition process temperatures and pressures, in order to avoid interference with the polymerization reaction. In addition, the monomer may be a mono- or di-substituted alkyl aromatic compound such as m-xylene, or other substituted aromatic compounds in which the substituent can be removed as described above and is itself unreactive with atomic oxygen. Moreover, the monomer may be benzene or a similar unsubstituted aromatic compound, such as naphthalene or biphenyl, in which carbon-hydrogen bonds may be severed to generate active aromatic radicals. Further, the monomer may be a substituted or unsubstituted aliphatic olefin compound, such as isoprene, in which free radicals are generated by radiation inducement and react with the atomic oxygen. Thus, the monomer provides the repeating hydrocarbon units, either aliphatic or aromatic, either substituted or unsubstituted, which appear in the final polymer product and which are linked to each other in the polymer through oxygen atoms.

The monomer precursor is provided in the reaction chamber as a vapor phase reactant. A vapor phase monomer is introduced into the reaction chamber under the control of a flow meter to provide a predetermined amount of monomer. For a solid or liquid monomer, the solid or liquid may be heated to a predetermined temperature in a container external to the reaction chamber to produce a desired vapor pressure, and vapors are then introduced into the reaction chamber either driven by force of their own vapor pressure or swept by an inert carrier gas, such as nitrogen or argon, under control of a flow meter. In order to prevent condensation of the vapor, it may be necessary to heat tubing through which the vapors pass in route to the reaction chamber. Optionally, the solid or liquid monomer may be placed in a container in the reaction chamber, in close proximity to the substrate, and heated to a predetermined temperature to produce the desired vapor pressure of the monomer. The vapor pressure of the monomer can be accurately and reproducibly controlled by controlling the temperature of the monomer solid or liquid.

Other oxygen-containing compounds useful for practicing the present invention are molecular oxygen ($O_2$) and nitrogen dioxide ($NO_2$) which can be dissociated by activated mercury to produce atomic oxygen. The flow-rate of the oxygen-containing compound is adjusted, depending on the reactivity of the compound. For example, the flow-rate of $O_2$ is lower than that of $N_2O$ specified herein since the former is more reactive toward ultraviolet radiation than the latter. Moreover, while mercury is used as a photosensitizer in conjunction with radiation from a low pressure mercury vapor lamp, other photosensitizers, such as cadmium, zinc or xenon, may be used with radiation having a wavelength corresponding to the absorption wavelength for that element. In addition, a medium pressure mercury vapor lamp may be used to provide a higher intensity output than a low pressure lamp and would be useful in conjunction with sensitizers other than mercury or for direct photolysis.

The mercury vapor is introduced into the reaction chamber by passing either the vapor phase monomer, an inert carrier gas (i.e. nitrogen or argon), the oxygen-containing gas, or a combination of any of these precursors through a vessel containing mercury at room temperature having mercury vapor above it (i.e. at a vapor pressure of about $10^{-3}$ torr or 0.1 pascals).

The substrate for the process of the present invention may be, for example, a semiconductor device such as a silicon wafer or a sapphire wafer, or an optical element such as a glass or plastic lens or slide.

Further, in accordance with the first process embodiment of the present invention, the production of atomic oxygen may be accomplished by direct photon absorption by the oxygen-containing precursor to produce direct dissociation of the oxygen-containing precursor without the use of a photosensitizing agent such as mercury. For the above-noted oxygen-containing precursors, radiation having a wavelength of 1849 Å is sufficient to cause dissociation of the precursor to form atomic oxygen. This 1849 Å radiation is also sufficient to directly produce active species from certain monomer precursors. The advantage of direct photolysis is that possible mercury contamination of the product is avoided. However, the mercury-sensitized photolysis may provide higher deposition rates.

Moreover, in accordance with the present invention, by controlling the relative proportions of the monomer and the oxygen-containing precursor, the oxygen content of the polyether product can be controlled. Using a high ratio of oxygen precursor to bromobenzene monomer, a polyphenylether having a refractive index of about 1.5 in the visible range can be obtained, whereas a relatively low ratio of oxygen precursor to bromobenzene provides a polyphenylether product having a refractive index of about 1.7. By using a very low proportion of the oxygen-containing precursor, a polyphenylether product having a refractive index approaching 1.9 can be obtained. Further, the composition and refractive index of the product can be changed in a continuous manner to provide a graded index material by changing the relative proportions of the reactants in a continuous manner and a predetermined pattern. The ratios of reactants are controlled by controlling the flow rate of each reactant by means of flow meters or mass flow controllers. In practice, flow rates from 0.001 to about 20 standard cubic centimeters per minute (sccm) are used for oxygen; flow rates from about 5 to about 100 sccm are used for nitrous oxide; and the organic monomer is provided at a flow rate from about 0.01 to about 100 times the maximum rate of the oxygen-containing precursor. The estimated flow rate of the monomer formed by vaporization of a solid or liquid is calculated by using the measured process parameters, such as rise of partial pressure in the isolated chamber volume or mass loss in the monomer container. The concentration of a liquid or solid monomer in the reaction chamber is determined, in part, by the vapor pressure of the monomer, which, in turn, is controlled by the temperature to which the monomer material is heated. Other factors determining the monomer concentration are the flow rate of carrier gas, if used, and a regulating valve. The monomer partial pressure in the reaction chamber can, thus, be accurately and reproducibly controlled.

Since the atomic oxygen required to react with the monomer is produced by radiation inducement, heat is not required to effect the reaction for producing the polyether of the present invention. Some heat may, however, be required in order to convert the monomer from a liquid or solid phase to the vapor phase. In the case of bromobenzene, a temperature of about 30° C. is sufficient to produce vaporization and a temperature of 30° C. or higher may be used for the substrate. These temperatures are low as compared to known methods for forming polymer layers. Typically, the process of the present invention is performed at a monomer source temperature in the range of 30° to 120° C. Higher temperatures may be used to increase the monomer vapor pressure in conjunction with equally high or higher substrate temperatures to prevent monomeric vapor condensation and subsequent loss of polymeric film uniformity. Similarly, temperatures lower than 30° C. for the substrate may enhance the deposition rate if the monomer source temperature is also lower than the substrate temperature. In addition, in order to prevent formation of the polymer or condensation of the monomer on the quartz window of the reaction chamber and the subsequent decrease in the amount of reaction-inducing radiation entering the chamber, the window is maintained at a temperature about 100° C. higher than the substrate.

The operating pressure in the photochemical vapor deposition chamber for the process of the present invention is typically within the range of about 0.1 to about 5 torr (about 10 to 700 pascals), although higher or lower pressures may be used if required. The operating pressure must be sufficiently low that the monomer vapors will not condense to the solid or liquid state and that a suitable mean free path for the activated reactive species and an acceptable rate of reaction are provided. The length of time required to deposit a polyether layer in accordance with the present invention depends on, among other things, the layer thickness and the deposition rate and may vary from about 0.5 hour to several hours. The rate of deposition is dependent on the temperature of the substrate, the intensity of the reaction-inducing radiation, the concentration of reactants, and the flow rates of the reactants.

A polyphenylether layer was formed in accordance with the present invention using bromobenzene and $O_2$ reactants as described in greater detail in Example 1. Infrared-absorption spectrographic analysis of this layer showed four distinct peaks at 3050, 1580, 1480, and 1220 $cm^{-1}$, which have positions and intensities corresponding to polyphenylether or polybromophenylether. This data confirms the formation of a polyether compound in accordance with the process of the present invention. In addition, EDAX (energy-dispersive analysis by x-rays) of this film detected bromine as evidenced by a peak at 12 electron-volts, which indicates that this film has elemental bromine constituted in the polyphenylether.

Thus, in accordance with the first process embodiment of the present invention there is provided a polyether layer which exhibits good insulating properties and good step coverage, which make such a material useful as an interlevel insulator in multilayer structures, as an insulator in metal-insulator-semiconductor devices, and as a dielectric layer in capacitors. Furthermore, the polyether layer is provided in accordance with the process of the present invention by a low-temperature process (e.g. 30° to 120° C.) which avoids or minimizes thermal damage to the substrate, and makes this process particularly well suited for applying an insulating layer to a temperature-sensitive substrate, such as a low-melting metal, a temperature-sensitive compound semiconductor material, a temperature-sensitive plastic material, or a semiconductor device substrate having predefined dopant regions. In addition, the photochemical vapor deposition process of the present invention avoids charge damage and radiation damage to the substrate and thus provides enhanced device performance as discussed in U.S. Pat. No. 4,371,587. Finally, the polyether layers formed in accordance with the present invention are resistant to acids and solvents, which makes them well suited for use as protective coatings or corrosion-resistant coatings for microelectronic components.

Turning now to the second process embodiment of the present invention, there is provided a low-temperature process for depositing on a substrate a layer of a polyamine. The polyamine is formed by a vapor phase photochemical vapor reaction between a nitrogen-containing compound and a chosen monomer, such as an aromatic, alkyl aromatic, halogenated aromatic, or aliphatic olefin compound. More particularly, in accordance with a specific embodiment of the present invention, a substrate is exposed to m-xylene and ammonia reactants and is irradiated with radiation having a wavelength of 1849 Å, which is sufficient to produce direct photolysis of the reactants. While not limiting the invention to a particular theory of operation, it is believed that the 1849 Å radiation produces direct photolysis of the ammonia to remove one, two, or three of the hydrogen atoms attached to the nitrogen and provides active nitrogen-containing radicals. In addition, it is believed that the radiation may remove one or more hydrogen atoms from the aromatic monomer by severing carbon-hydrogen bonds in the pendant groups or on the aryl ring itself to generate active substituted aromatic groups. The active nitrogen-containing radicals and the active aromatic groups interact to form the polymer. The overall reaction may be represented in equation (5) below.

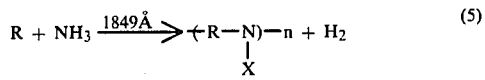

(5)

where
R = monomer molecule or radical
X = H or polymer chain
n = degree of polymerization = about 20 to 100 or higher.

More specifically, one possible reaction of m-xylene with NH$_3$ to form polyxyleneamine is represented in equation (6) below.

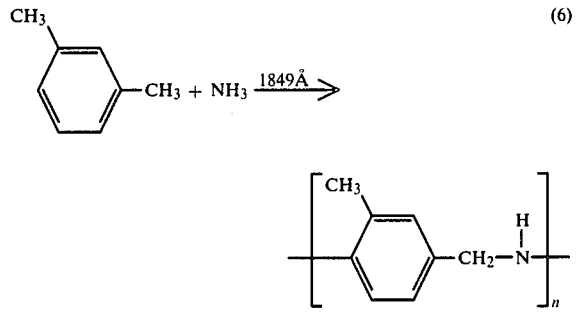

(6)

In addition to a dialkyl substituted aromatic compound, such as m-xylene discussed above, the monomer may be a mono-alkyl substituted aromatic compound. Alternatively, the monomer may be a halogenated aromatic compound capable of having one or more carbon-halogen bonds severed by radiation to generate active aromatic radicals, as discussed above. The monomer may be mono- or dihalogenated. Further, the monomer may be an unsubstituted aromatic compound, such as benzene, in which multiple hydrogen atoms are removed by radiation treatment to generate active aryl or arylene radicals. Other suitable aromatic monomers include naphthalene or biphenyl. Finally, the monomer may be a substituted or unsubstituted alphatic olefin compound, such as isoprene, in which free radicals are generated by radiation inducement and react with the nitrogen-containing radicals.

The preferred nitrogen-containing compound is ammonia, but other suitable compounds are hydrazine or primary lower alkyl amines which can be vaporized, such as methylamine, and which are capable of having at least one nitrogen-hydrogen bond severed to generate active amine radicals as indicated above. Alternatively, a mixture of nitrogen-containing compounds may be used in order to tailor the polymer properties, such as extent of cross-linking. The vapor phase nitrogen compound is provided at a flow rate of about 0.05 to about 100 sccm.

Further, in accordance with the second process embodiment of the present invention, the desired photochemical reaction may be achieved using mercury sensitization and radiation having a wavelength of 2537 Å. As previously discussed, the radiation at 2537 Å is absorbed by the mercury to produce mercury in an excited state (Hg*), which then interacts with the reactants to effect a reaction similar to that indicated in equation (5) above.

Moreover, in accordance with the present invention, by controlling the relative proportions of the monomer and the nitrogen-containing precursor, the nitrogen content of the polyamine product can be controlled to provide a layer with a refractive index of about 1.6±0.1. Further, the composition and refractive index of the polyamine layer can be varied in a continuous manner to provide a graded index material, as previously discussed with regard to the first process embodiment of the present invention.

The process of the second embodiment of the present invention is typically performed at a low temperature, namely room temperature to about 100° C., with higher temperatures being used if required for other reasons. The operating pressure used is typically within the range of about 0.1 to 5 torr (10 to 700 pascals), but higher pressures may be used if needed. Deposition times may vary from about 0.5 hour to several hours depending on the deposition rate and the thickness of the deposited layer. The general procedure previously described herein for the formation of a polyether layer is followed, with the above-noted changes for forming a polyamine layer.

A polyxyleneamine layer formed in accordance with the present invention and described in greater detail in Example 10 was found to have a refractive index of about 1.60. Auger analysis of this film detected a significantly higher nitrogen content than oxygen content compared with the polyether product formed by the radiation-induced reaction between xylene and oxygen. These results are indicative of the incorporation of nitrogen bonding to form amine groups in the polymer formed in accordance with the second embodiment of this invention.

Thus, in accordance with the second process embodiment of the present invention there is provided a layer of a polyamine deposited on a substrate by a low temperature, charge-free photochemical vapor deposition process which provides the advantages previously discussed with regard to the first process embodiment of this invention. Polyamines as a class of polymers have been previously unexplored for electronic applications. In many respects, polyamines are analogous to polyethers, with an N-H group replacing the oxygen atom. However, the higher chemical reactivity of an NH group in polyamine can provide additional advantages. For example, a polyamine layer according to the present invention can be used as an adhesion layer or adhesion promoter and will bond strongly to high surface energy inorganic materials, such as silicon dioxide, aluminum oxide, or titanium dioxide, and will also be coupled through the amine group to an overlayer epoxy coating.

Finally, because of the similarity between the photochemical vapor deposition process for the deposition of an inorganic sulfide as described in U.S. Pat. No. 4,447,469 and the photochemical process for the deposition of an inorganic oxide as described in U.S. Pat. No. 4,371,587, it is expected that a sulfur-containing precursor may be reacted with a chosen monomer in accordance with a third process embodiment of the present invention to provide a polysulfide product. Suitable sulfur-containing precursors include carbonyl sulfide, hydrogen sulfide, dialkyl sulfide, carbon disulfide, and methyl mercaptan. Suitable monomers include those used in the formation of the polyethers and polyamines of the present invention. The photolysis may be accomplished by direct dissociation or by mercury-sensitized dissociation. However, since sulfur is known to react strongly with mercury, the mercury-sensitized process may result in mercury being incorporated into the polymer film. The general procedure previously discussed in relation to the formation of polyether layers is followed, with the above-noted changes for the formation of polysulfide layers. Such polysulfide layers are useful as insulator layers in semiconductor devices and as protective or passivation layers for microelectronic devices.

EXAMPLE 1

This example illustrates the formation of a layer of polyphenylether in accordance with the first process embodiment of the present invention as previously described in detail and as summarized in Table I. A known chemical vapor deposition system, as generally described in U.S. Pat. No. 4,371,587, was used. The substrate was a 3-inch (7.62 cm) long, 0.5-inch (1.27 cm) wide chip from a three-inch silicon wafer and the temperature of the substrate was 45° C. The oxygen-containing compound was oxygen and the monomer was bromobenzene. Mercury-sensitized photolysis was used, with radiation at 2537 Å being provided by a low pressure mercury vapor lamp at an intensity on the substrate of about 10 milliwatts/cm$^2$. The mercury was introduced into the reaction chamber from an adjacent mercury reservoir through which the reactant gases flowed. The bromobenzene monomer was contained in a vessel at 30° C. external to the reaction chamber and was introduced into the reaction chamber under its own vapor pressure. The flow rate of oxygen was estimated to be about 0.01 sccm; and the flow rate of the monomer was estimated to be about 0.2 to 1 sccm or about 1 to 5 mg/minutes. The operating pressure was about 1.3 torr (170 pascals). The deposition process was conducted for 6 hours to provide a layer of polyether that was 3000 Å thick and had a refractive index of 1.74, as measured by ellipsometry. The infrared and Auger analyses for bonding structure and the electrical measurements of this type of layer have been previously discussed herein.

EXAMPLE 2

The process described in Example 1 was followed except that direct photolysis with 1849 Å radiation was used in place of the mercury-sensitized photolysis, the flow rate of O$_2$ was about 2 sccm, and the operating pressure was about 1.6 torr (mm of mercury). The deposition was conducted for 3 hours and produced a deposited layer 1300 Å thick, having a refractive index of about 1.7. Repetition of the above-described experiment with oxygen minimized to about 0.01 sccm (estimated) resulted in a thinner film with a higher refractive index (i.e. 1.9), thus demonstrating variation in the refractive index of the thin film with variation in the oxygen partial pressure.

EXAMPLE 3

The process described in Example 1 was followed except that the oxygen-containing compound was nitrous oxide with a flow rate of about 40 sccm, and the operating pressure was about 1.6 torr (210 pascals). The deposition was conducted for one hour and resulted in a deposited layer of about 440 Å thickness with a refractive index of about 1.5.

EXAMPLE 4

The process described in Example 2 was followed except that the monomer was iodobenzene flowing at about the same flow rate as the monomer of Example 2, and the oxygen had a flow rate of about 0.5 sccm. The operating pressure was about 400 millitorr. Deposition for 2.5 hours produced a layer about 500 Å thick, having a refractive index of about 1.65 after post-baking at 100° C.

EXAMPLE 5

The process described in Example 2 was followed except that the monomer was benzene, which was stored in a container remote from the reaction chamber and was introduced into the reaction chamber at a flow rate of about 1 sccm. The O$_2$ reactant was introduced into the reaction chamber at a flow rate of 15 sccm. The deposition pressure was about 5.0 torr (760 pascals). The deposited layer had a thickness of about 500 Å with a refractive index of about 1.53, and was formed in 6 hours.

EXAMPLES 6-9

These examples illustrate the formation of layers of various polyether compounds in accordance with the first process embodiment of the present invention. The process described in Example 2 using direct photolysis was followed except that the reactants used were as indicated in Table I. The reaction conditions and results are also indicated in Table I.

EXAMPLE 10

This example illustrates the formation of a layer of polyxyleneamine in accordance with the second process embodiment of the present invention, as previously described in detail. The substrate was a 0.5 inch (1.27 cm) wide chip from a three-inch (7.62 cm) silicon wafer and the temperature of the substrate was about 45° C. The monomer was m-xylene which was provided at a flow rate of 6 sccm. The nitrogen-containing precursor was ammonia which was provided at a flow rate of about 5 sccm. Radiation at a wavelength of 1849 Å was used to effect direct photolysis. A layer of polymer was deposited on a silicon wafer to a thickness of 600 Å after 5.5 hours, and was found to have a refractive index of 1.62. For purposes of comparison, the photopolymerization of m-xylene in the presence of oxygen flowing at 10 sccm resulted in a deposit of about 850 Å thickness after 4.7 hours (see Example 8 in Table I) and was found to have an index of about 1.6.

TABLE I
POLYETHERS FORMED BY PHOTO-CVD

| EXAMPLE NO. | REACTANTS | CONDITIONS | RESULTS (thickness; refractive index) |
|---|---|---|---|
| 1 | Bromobenzene/$O_2$ | 6 hr./45° C./S | 3000Å; n = 1.74 |
| 2a | Bromobenzene/$O_2$ | 3 hr./45° C./D | 1300Å; n ≅ 1.7 |
| 2b | Bromobenzene/$O_2$ | 2.9 hr./45° C./D | 880Å; n = 1.91 |
| 3 | Bromobenzene/$N_2O$ | 1 hr./45° C./S | 440Å; n ≅ 1.5 |
| 4 | Iodobenzene/$O_2$ | 2.5 hr./45° C./D | 500Å; n = 1.65 |
| 5 | Benzene/$O_2$ | 6 hr./45° C./D | 500Å; n = 1.53 |
| 6 | Hexafluorobutadiene/$O_2$ | 60 min./45° C./D | 300Å |
| 7a | Isoprene/$O_2$ | 30 min./100° C./D | 30Å |
| 7b | Isoprene/$O_2$ | 200 min./55° C./D | 480Å; n = 1.55 |
| 8 | Xylene/$O_2$ | 4.7 hr./45° C./D | 850Å; n = 1.6 |
| 9 | Fluorobenzene/$O_2$ | 2.5 hr./45° C./D | 200Å |

S = mercury-sensitized photolysis
D = direct photolysis

In addition, the deposition rate without either oxygen or ammonia added is about 100 Å in one hour.

EXAMPLE 11

This example illustrates the formation of a layer of a polysulfide in accordance with a third process embodiment of the present invention, as previously described in detail. The substrate is a three-inch (7.62 cm) silicon wafer and the substrate temperature is 45° C. The monomer is bromobenzene, and the sulfur-containing compound is carbonyl sulfide. Photolysis is accomplished by direct photolysis using radiation having a wavelength of 1849 Å.

Having thus described exemplary embodiments of the present invention, it should be noted by those skilled in the art that the disclosures within are exemplary only and that various other alternatives, adaptations, and modifications may be made within the scope of the present invention. Accordingly, the present invention is not limited to the specific embodiments as illustrated herein.

What is claimed is:

1. Process for forming on the surface of a substrate a layer of a chosen organic polymer comprising repeating hydrocarbon units joined through an element selected from the group consisting of oxygen, nitrogen and sulfur, comprising exposing said substrate to a first vapor phase reactant comprising the monomer precursor of said repeating hydrocarbon units and a second vapor phase reactant comprising the precursor of said oxygen, nitrogen, or sulfur in the presence of radiation of a predetermined wavelength to bring about the reaction between said first and second vapor phase reactants to form said chosen polymer which deposits on said surface of said substrate.

2. The process as set forth in claim 1 wherein:
   (a) said exposing occurs in the presence of mercury vapor as a photosensitizer; and
   (b) said radiation is provided by a low pressure mercury vapor lamp.

3. The process as set forth in claim 1 wherein the relative proportions of said first and second vapor phase reactants are controlled to thereby produce said polymer comprising a predetermined proportion of said element.

4. The process set forth in claim 1 wherein said precursor of oxygen is selected from the group consisting of nitrous oxide, nitrogen dioxide, and molecular oxygen.

5. The process set forth in claim 1 wherein said precursor of nitrogen is selected from the group consisting of ammonia, hydrazine, and a primary alkyl amine.

6. The process set forth in claim 1 wherein said precursor of sulfur is selected from the group consisting of carbonyl sulfide, hydrogen sulfide, dialkyl sulfide, carbon disulfide, and methyl mercaptan.

7. The process set forth in claim 1 wherein said monomer precursor is selected from the group consisting of an aliphatic olefin, an aromatic, an alkyl aromatic, and a halogenated aromatic compound.

8. The process set forth in claim 7 wherein said monomer is bromobenzene.

9. The process set forth in claim 7 wherein said monomer is iodobenzene.

10. The process set forth in claim 7 wherein said monomer is m-xylene.

11. The process set forth in claim 7 wherein said monomer is isoprene.

12. The process set forth in claim 7 wherein:
   (a) said monomer precursor is bromobenzene;
   (b) said precursor of oxygen is molecular oxygen;
   (c) said exposing occurs in the presence of mercury vapors;
   (d) said predetermined wavelength of radiation is 2537 angstroms; and
   (e) said polymer comprises polyphenylether.

13. The process set forth in claim 7 wherein:
   (a) said monomer precursor is iodobenzene;
   (b) said precursor of oxygen is molecular oxygen;
   (c) said predetermined wavelength of radiation is 1849 angstroms; and
   (d) said polymer comprises polyphenylether.

14. The process set forth in claim 5 wherein:
   (a) said monomer precursor is m-xylene;
   (b) said precursor of nitrogen is ammonia;
   (c) said predetermined wavelength of radiation is 1849 angstroms; and
   (d) said polymer comprises polyxyleneamine.

* * * * *